United States Patent
Okamoto

(10) Patent No.: US 9,197,227 B2
(45) Date of Patent: Nov. 24, 2015

(54) SEMICONDUCTOR DEVICE

(71) Applicant: Renesas Electronics Corporation, Kawasaki-shi (JP)

(72) Inventor: Toshiharu Okamoto, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/329,826

(22) Filed: Jul. 11, 2014

(65) Prior Publication Data
US 2015/0028956 A1   Jan. 29, 2015

(30) Foreign Application Priority Data

Jul. 23, 2013   (JP) ................................ 2013-152802

(51) Int. Cl.
*H03B 5/32*   (2006.01)
*H03L 7/16*   (2006.01)
*H03B 5/36*   (2006.01)
*H03B 5/30*   (2006.01)

(52) U.S. Cl.
CPC .. *H03L 7/16* (2013.01); *H03B 5/30* (2013.01); *H03B 5/36* (2013.01)

(58) Field of Classification Search
CPC ................................... H03B 5/36; H03B 5/30
USPC ........ 331/158, 116 FE, 116 R, 175, 183, 185, 331/74
See application file for complete search history.

(56) References Cited

U.S. PATENT DOCUMENTS 6,166,609 A     12/2000  Nakamiya et al.
8,922,288 B2 *  12/2014  Brekelmans et al. ......... 331/158

FOREIGN PATENT DOCUMENTS

JP   2001-257532 A   9/2001
JP   2002-252331 A   9/2002
JP   2009-152747 A   7/2009

* cited by examiner

Primary Examiner — Arnold Kinkead
(74) Attorney, Agent, or Firm — McGinn IP Law Group, PLLC

(57) ABSTRACT

The disclosed invention is intended to adjust the driving power of an oscillation circuit to be optimal with a simple circuit configuration. A chip includes an oscillation circuit, an amplifier, an effective value measuring circuit, and a control unit. The oscillation circuit includes an inverting amplifier and a resistor coupled in parallel to the inverting amplifier. The oscillation circuit in which the inverting amplifier is coupled to a crystal oscillator outside the chip generates an oscillation circuit by driving the crystal oscillator. The effective value measuring circuit measures an effective value of an oscillation signal produced by the oscillation circuit. The control unit controls the gain of the inverting amplifier so that the effective value will be equal to a target voltage.

14 Claims, 13 Drawing Sheets

FIG. 7

| GAIN (W SIZE RATIO) | CTR1 | CTR1 [2] | CTR1 [1] | CTR1 [0] |
|---|---|---|---|---|
| 1 | 3'h0 | 0 | 0 | 0 |
| 2 | 3'h1 | 0 | 0 | 1 |
| 3 | 3'h2 | 0 | 1 | 0 |
| 4 | 3'h3 | 0 | 1 | 1 |
| 5 | 3'h4 | 1 | 0 | 0 |
| 6 | 3'h5 | 1 | 0 | 1 |
| 7 | 3'h6 | 1 | 1 | 0 |
| 8 | 3'h7 | 1 | 1 | 1 |

US 9,197,227 B2

SEMICONDUCTOR DEVICE

CROSS-REFERENCE TO RELATED APPLICATIONS

The disclosure of Japanese Patent Application No. 2013-152802 filed on Jul. 23, 2013 including the specification, drawings and abstract is incorporated herein by reference in its entirety.

BACKGROUND

The present invention relates to a semiconductor device and relates to, for example, a semiconductor device including an oscillation circuit that drives a crystal oscillator.

It is known that, in various semiconductor devices, an oscillation signal is produced by driving a crystal oscillator outside a chip by an oscillation circuit provided in the chip and used as a clock signal.

In order to diminish radiation noise that is generated by an oscillation circuit due to a high-frequency distortion component, it is necessary to decrease the gain of an inverting amplifier that is coupled to the crystal oscillator and reduce the amplitude level of an oscillation signal as small as possible. Note that the amplitude level of an oscillation signal means a "peak to peak" level of an oscillation signal and it will hereinafter be denoted by "$V_{p\text{-}p}$".

On the other hand, if the gain of the inverting amplifier is set too small, it may lead to no oscillation. Thus, it is necessary to set the amplitude level $V_{p\text{-}p}$ as large as possible to ensure oscillation allowance and S/N (signal-noise ratio).

In view of such a dilemma, it is desired to control the gain of the inverting amplifier so that the amplitude level $V_{p\text{-}p}$ of an oscillation signal should be less than a power supply voltage VCC, whereas it should be as close to the power supply voltage VCC as possible.

An oscillator disclosed in Patent Document 1 includes an oscillation unit including a plurality of oscillation circuits with different degrees of oscillation allowance and a peak detecting unit that detects a peak output voltage (equivalent to the amplitude level $V_{p\text{-}p}$) that is output by the oscillation unit. Based on the amplitude level $V_{p\text{-}p}$ detected by the peak detecting unit, one of the oscillation circuits is selected for use as an oscillation circuit to drive a crystal oscillator.

Patent Document 2 discloses a technique for adjusting the gain of an inverting amplifier in an oscillation circuit, based on the amplitude level $V_{p\text{-}p}$. This technique is, in principle, similar to the technique disclosed in Patent Document 1.

One-chip microcomputer disclosed in Patent Document 3 detects a high-frequency component from an oscillation signal and adjusts the gain of an inverting amplifier and the resistance of a damping resistor, based on a result of the detection.

RELATED ART DOCUMENTS

Patent Documents

[Patent Document 1] Japanese Unexamined Patent Application Publication No. 2009-152747
[Patent Document 2] Japanese Unexamined Patent Application Publication No. 2001-257532
[Patent Document 1] Japanese Unexamined Patent Application Publication No. 2002-252331

SUMMARY

In the oscillator disclosed in Patent Document 1, the peak detecting unit detects the amplitude level $V_{p\text{-}p}$ of an oscillation signal. Hence, it cannot make a detection distinguishing between a rectangular-like waveform and a sine-like waveform having the same amplitude level $V_{p\text{-}p}$.

Because the proportion of a high-frequency component included in a rectangular-like waveform is larger, the influence of radiation noise on the rectangular-like waveform is larger than on a sine-like waveform.

Therefore, it is difficult for the technique disclosed in Patent Document 1 to reduce radiation noise positively. This is also true for the technique disclosed in Patent Document 2.

In the technique disclosed in Patent Document 3, a high-frequency component detecting circuit having a large circuit size is required and, therefore, there is a problem of having to increase the circuit size of an entire semiconductor device.

Other problems and novel features will be apparent from the following description of the present specification and the accompanying drawings.

A semiconductor device according to an embodiment measures an effective value of an oscillation signal which is output by an oscillation circuit that produces an oscillation signal by driving a crystal oscillator and adjusts the gain of an inverting amplifier included in the oscillation circuit so that the effective value will be equal to a target voltage.

An alternative and equivalent method and system to the semiconductor device of the above embodiment and a chip including the semiconductor device are also effectual as aspects of the present invention.

According to the foregoing semiconductor device pertaining to the above embodiment, it is possible to adjust optimally the driving power of the oscillation circuit with a simple circuit configuration.

BRIEF DESCRIPTION OF THE DRAWINGS

FIG. 7 is a diagram representing correlations between the combinations of bit values of a control signal from a trimming controller and the gain values of the inverting amplifier depicted in FIG. 6.

DETAILED DESCRIPTION

Figure 1:
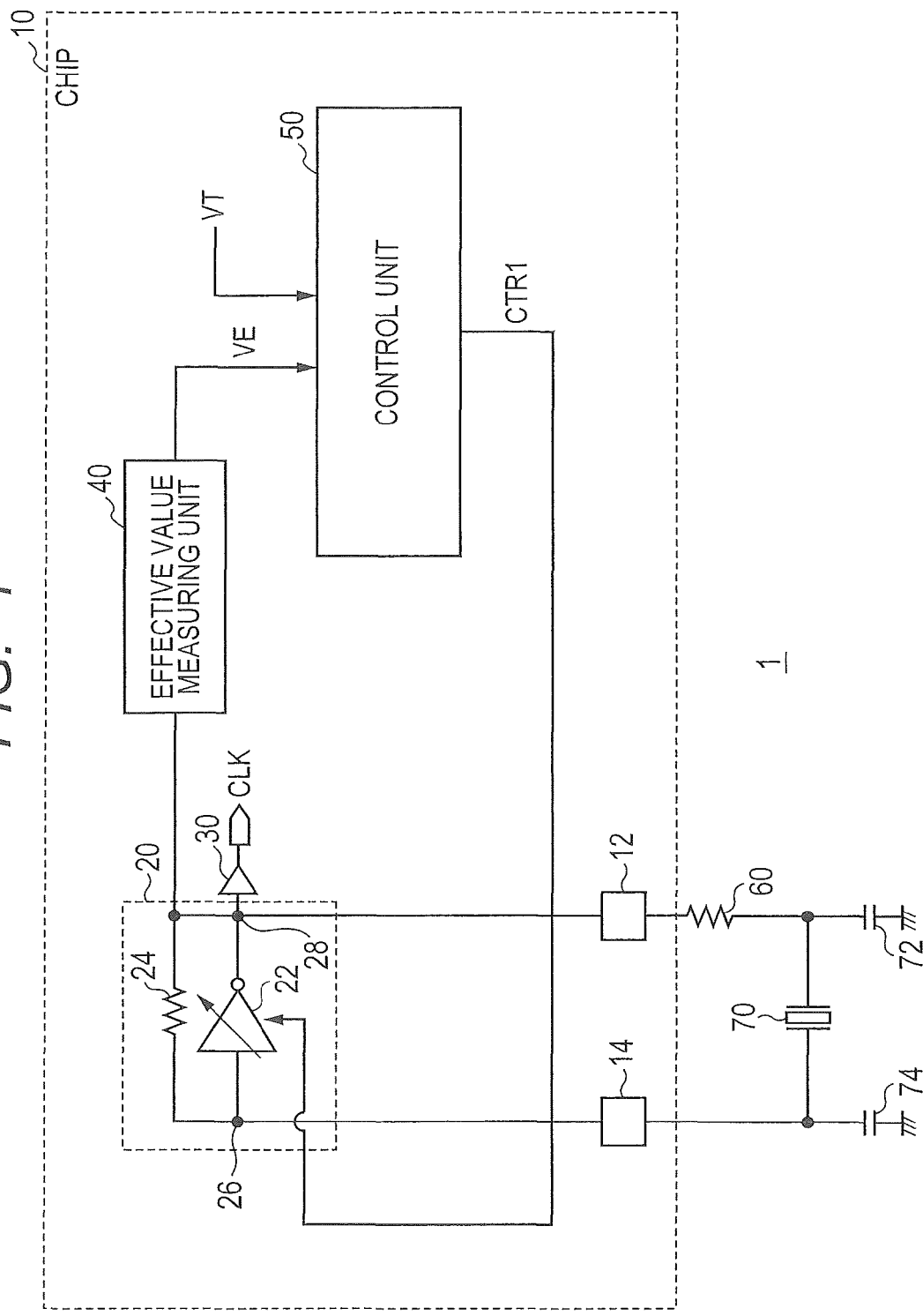
FIG. 1 is a diagram depicting a semiconductor device pertaining to a first embodiment.

For the sake of clarity of description, the following description and drawings are condensed and simplified, if appropriate. In the drawings, the same components are assigned the same reference numerals and duplicated descriptions are omitted as appropriate. For the sake of simplicity, in the drawings, power supply lines to functional blocks that need a power supply and to elements included in these functional blocks are omitted.

First Embodiment

FIG. 1 is a diagram depicting a semiconductor device 1 pertaining to a first embodiment. The semiconductor device 1 includes a chip 10 and a crystal oscillator 70 provided outside the chip 10.

The chip 10 includes an oscillation circuit 20, an amplifier 30, an effective value measuring circuit 40, and a control unit 50. The oscillation circuit 20 includes an inverting amplifier 22 and a resistor 24 coupled in parallel to the inverting amplifier 22.

An input terminal 26 of the inverting amplifier 22 is coupled via a pad 14 to one end of the crystal oscillator 70 and an output terminal 28 of the inverting amplifier 22 is coupled via a pad 12 and a damping resistor 60 to the other end of the crystal oscillator 70. Both the ends of the crystal oscillator 70 are grounded via a capacitor 72 and a capacitor 74, respectively.

A voltage (i.e., an oscillation signal) at the output terminal 28 of the inverting amplifier 22 is supplied as a clock signal CLK via the amplifier 30 to other logic circuits, which are not depicted, within the chip.

The effective value measuring circuit 40 to which an oscillation signal from the oscillation circuit 20 is input measures an effective value VE of the oscillation signal and outputs it to the control unit 50.

The control unit 50 adjusts the driving power of the inverting amplifier 22 to drive the crystal oscillator 70 so that the effective value VE measured by the effective value measuring circuit 40 will be equal to a target voltage.

In the present embodiment, the gain of the inverting amplifier 22 is variable and the control unit 50 generates a control signal CTRL and outputs it to the inverting amplifier 22 to adjust the gain of the inverting amplifier 22, thereby adjusting the driving power of the inverting amplifier 22.

Here, a technical principle relevant to the first embodiment is described. As noted previously, it is required that the amplitude level $V_{p-p}$ of an oscillation signal should be less than a power supply voltage VCC, whereas it should be as close to the power supply voltage VCC as possible in order to reduce radiation noise and ensure oscillation allowance and S/N (signal-noise ratio). An ideal amplitude level $V_{p-p}$ that satisfies this requirement is equal to the power supply voltage VCC. This amplitude level $V_{p-p}$ is referred to as an "ideal amplitude level".

However, if the oscillation circuit's driving power is too large, because of saturation, it outputs an oscillation signal of a rectangular wave having an amplitude level $V_{p-p}$ that is the same level as the power supply voltage VCC. Because the power supply voltage VCC is the ideal amplitude level, in this case, it is impossible to make an optimal adjustment by adjusting the driving power of the oscillation circuit, based on whether the amplitude level $V_{p-p}$ of an oscillation signal is the ideal amplitude level, as in Patent Document 1 or Patent Document 2, since it is impossible to distinguish between a rectangular wave and a sine wave.

That is, to determine whether or not the driving power of the oscillation circuit is optimal, in addition to determining whether or not the amplitude level $V_{p-p}$ of an oscillation signal is the ideal amplitude level, it is necessary to determine whether or not the oscillation signal is a sine wave.

The present inventors focused attention on that, if an oscillation signal is a sine wave, its effective value will be "$1/(\sqrt{2})$" times the amplitude level $V_{p-p}$ and thought up an idea as below. About "$1/(\sqrt{2})$" times the ideal amplitude level (for example, power supply voltage VCC) should be specified as a target voltage VT. If an effective value of an oscillation signal is equal to the target voltage VT, it can be determined that the amplitude level $V_{p-p}$ of the oscillation signal is the ideal amplitude level and the oscillation signal is a sine wave.

The chip 10 of the semiconductor device 1 was contrived, based on the above idea. The control unit 50 in the chip 10, based on an effective value VE measured by the effective value measuring circuit 40 and a target voltage VT, adjusts the driving power of the oscillation circuit 20 so that the effective value VE will be equal to the target voltage VT. As a result, an oscillation signal whose amplitude level $V_{p-p}$ is the ideal amplitude level is output on the assumption that no saturation occurs.

According to the first embodiment, the driving power of the oscillation circuit 20 is adjusted optimally in a simple configuration described above. Thereby, both reducing radiation noise positively and ensuring oscillation allowance and S/N (signal-noise ratio) can be achieved.

Second Embodiment

In the first embodiment, the control unit 50 exerts control so that the driving power of the oscillation circuit 20 will be optimal by adjusting the gain of the inverting amplifier 22. However, if the driving power of the oscillation circuit 20 can be controlled to be optimal, an object to be adjusted is not limited to the gain of the inverting amplifier 22.

Figure 2:
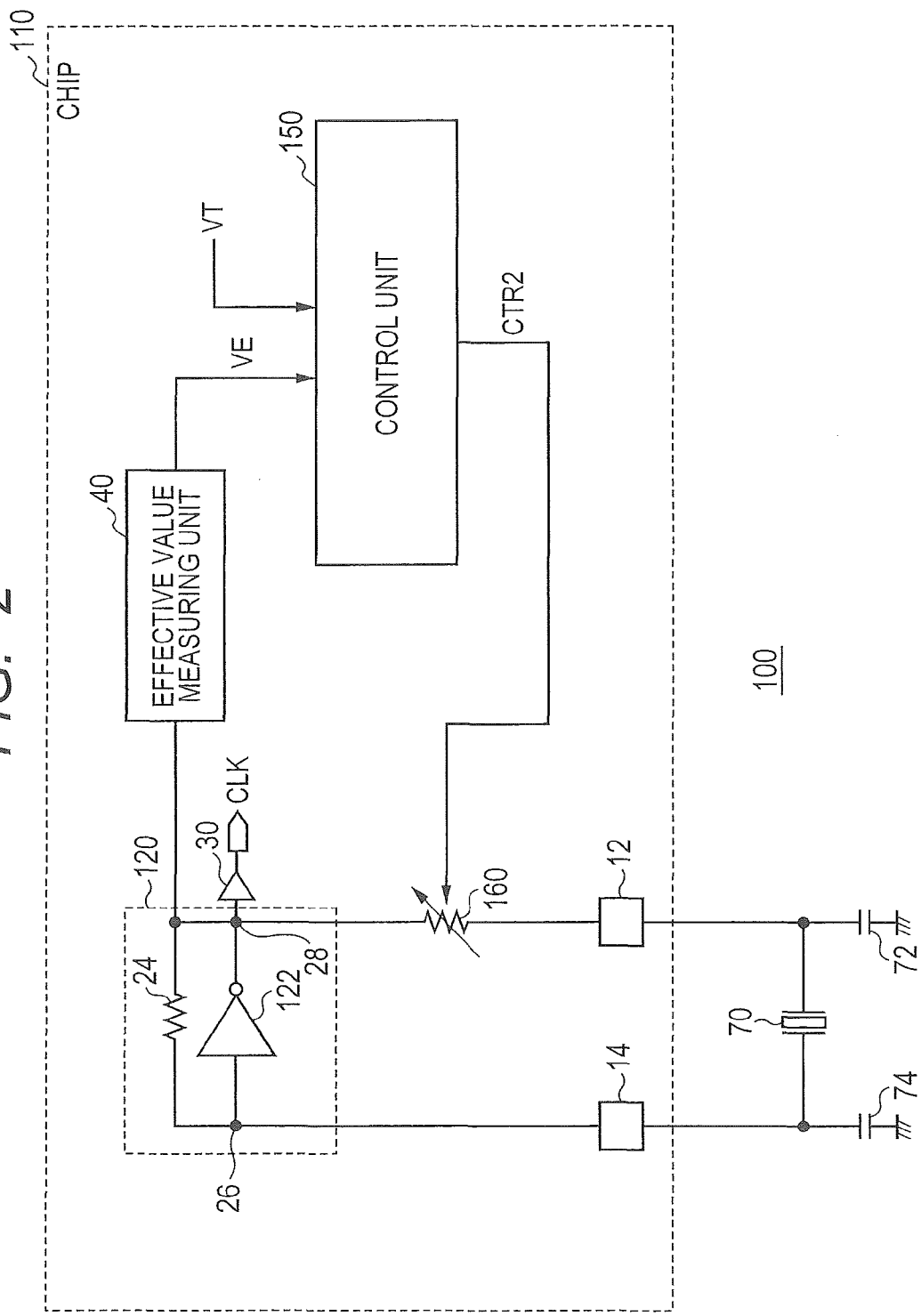
FIG. 2 is a diagram depicting a semiconductor device pertaining to a second embodiment.

FIG. 2 depicts a semiconductor device 100 pertaining to a second embodiment as an example in which an object to be adjusted is other than the gain of the inverting amplifier 22. The semiconductor device 100 is described only in respects in which it differs from the semiconductor device 1.

In a chip 110 of the semiconductor device 100, an oscillation circuit 120 is the same as the oscillation circuit 20 except that an inverting amplifier 122 whose gain is not variable is provided instead of the inverting amplifier 22 whose gain is variable.

The damping resistor 60 is provided outside the chip 10 in the semiconductor device 1, whereas a damping resistor 160 corresponding to the damping resistor 60 is provided within the chip 110 and its resistance value is variable in the semiconductor device 100.

Instead of controlling the gain of the inverting amplifier 22 with the control signal CTR1, a control unit 150 in the chip 110 of the semiconductor device 100 outputs a control signal CTR2 to the damping resistor 160 and adjusts the driving power of the oscillation circuit 120 by adjusting the resistance value of the damping resistor 160.

The control unit 150 adjusts the resistance value of the damping resistor as the object to be adjusted, instead of the gain of the inverting amplifier. Except for this respect, the control unit 150 makes an adjustment according to same principle and method of adjustment as for the control unit 50. Thus, the semiconductor device 100 pertaining to the second embodiment can produce the same advantageous effect as can be produced by the semiconductor device 1.

Besides, in the case of the semiconductor device 100, the damping resistor is built in the chip and, thus, the number of external parts can be decreased.

Of course, the inverting amplifier whose gain is variable may be used in the oscillation circuit, while the damping resistor whose resistance value is variable is built in the chip, and, by adjusting both the gain of the inverting amplifier and the resistance value of the damping resistor, the driving power of the oscillation circuit may be controlled to be optimal.

In this case, besides all the advantageous effects of the semiconductor device 1 and the semiconductor device 100, it is possible to further produce advantageous effects; i.e., expanding the range of adjusting the driving power of the oscillation circuit and reducing the circuit size of the oscillation circuit and the damping resistor.

Third Embodiment

Figure 3:
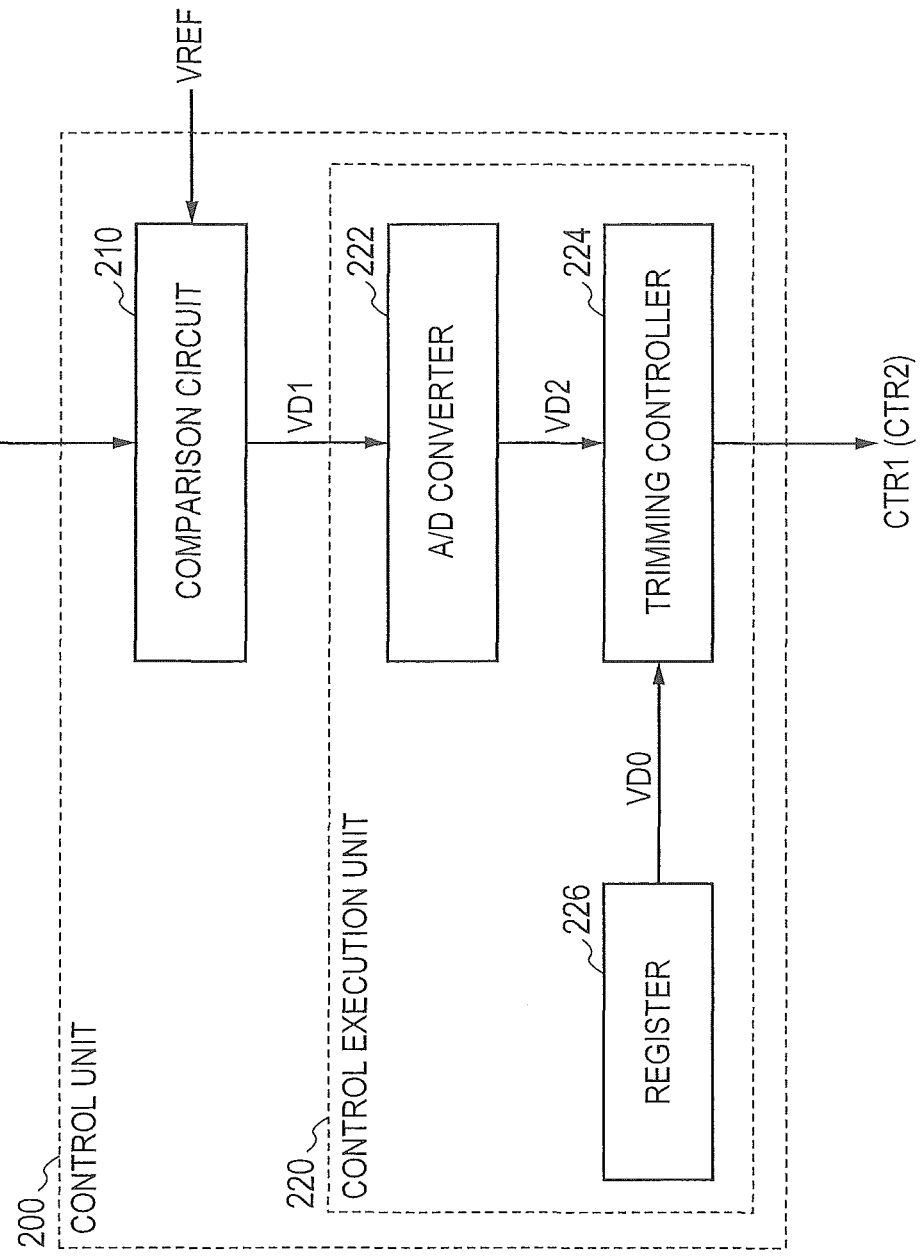
FIG. 3 is a diagram depicting a control unit in a semiconductor device pertaining to a third embodiment.

A third embodiment is also a semiconductor device. The semiconductor device has a control unit 200 that is configured as depicted in FIG. 3; the control unit 50 in the semiconductor device 1 or the control unit 150 in the semiconductor device 100 is also configured like this. Description of the third embodiment focuses on only the control unit 200. For explanatory convenience, the control unit 200 is assumed to have been applied in the semiconductor device 1.

As depicted in FIG. 3, the control unit 200 includes a comparison circuit 210 and a control execution unit 220. The control execution unit 220 includes an A/D converter 222, a trimming controller 224, and a register 226.

An effective value VE measured by the effective value measuring circuit 40 and a reference voltage VREF are input to the comparison circuit 210. The comparison circuit 210 compares the effective value VE and the reference voltage VREF and outputs a result of comparison to the control execution unit 220. A description about the reference voltage VREF will be described later. The reference voltage VREF differs from the target voltage VT.

The control execution unit 220 controls the gain of the inverting amplifier 22, based on a result of comparison made by the comparison circuit 210.

In the present embodiment, the comparison circuit 210 obtains a difference VD1 between the effective value VE and the reference voltage VREF as a result of comparison.

In the control execution unit 220, the A/D converter 222 makes an A/D conversion of the difference VD1 from the comparison circuit 210, obtains a difference VD2 which is a digital value, and outputs it to the trimming controller 224.

The trimming controller 224 compares the difference VD2 from the A/D converter 222 and a target difference value VD0, as will be described later, which has been set in the register 226. According to a result of the comparison, the trimming controller 224 generates a control signal CTR1 and outputs it to the inverting amplifier 22.

The purpose of the control unit 200 is to control the driving power of the oscillation circuit so that an effective value VE will be equal to the above-mentioned target voltage VT. An effective value VE is not necessarily to be compared to the target voltage VT.

If the reference voltage VREF is a voltage level other than the target voltage VT as in the present embodiment, the target difference value VD0 should be set so that an effective value VE will be equal to the target voltage VT when a match has occurred between the difference VD2 from the A/D converter 222 and the target difference value VD0 stored in the register 226. In this way, the foregoing purpose of the control unit 200 can be achieved.

Moreover, instead of an oscillation signal's effective value VE itself, another value that can represent an effective value VE may be measured for an oscillation signal and supplied to the comparison circuit 210 for comparison to the reference voltage VREF. This will be detailed later in conjunction with further embodiments.

Fourth Embodiment

Figure 4:
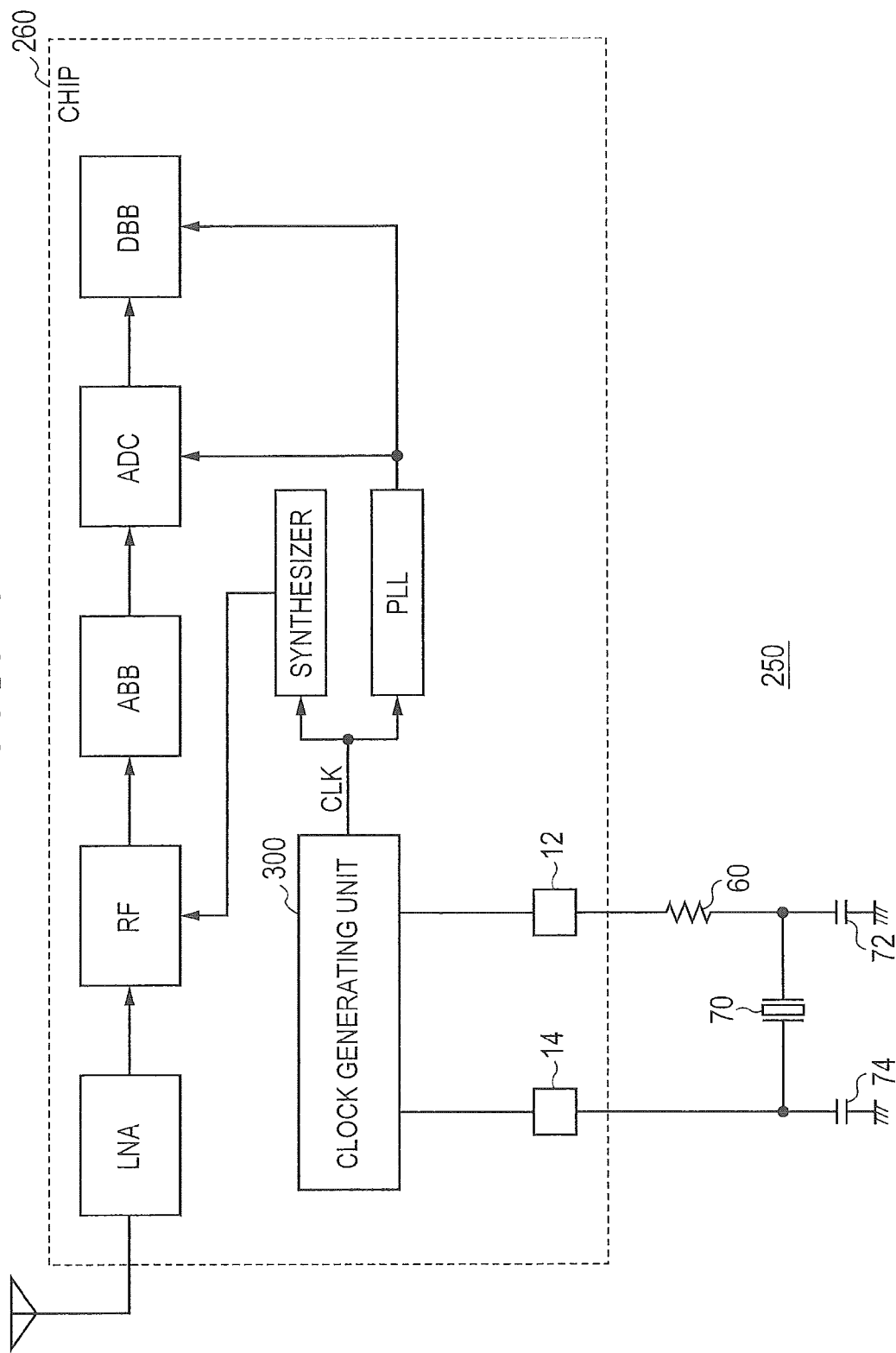
FIG. 4 is a diagram depicting a receiver pertaining to a fourth embodiment.

FIG. 4 depicts a receiver 250 pertaining to a fourth embodiment. The receiver 250 includes a chip 260 and a crystal oscillator 70 provided outside the chip 260.

In the chip 260, the following are provided: an LNA (Low Noise Amplifier), an RF unit (RF: Radio Frequency), an ABB unit (ABB: Analog BaseBand), an A/D converter (ADC), a DBB unit (DBB: Digital BaseBand), a synthesizer, a PLL circuit (PLL: phase locked loop), and a clock generating unit 300.

The functional blocks of the chip 260 except for the clock generating unit 300 are the same as those provided in a commonly used receiver and, thus, their description is omitted.

The clock generating unit 300 produces an oscillation signal by driving the crystal oscillator 70. The oscillation signal is supplied to the synthesizer and PLL circuit as a clock signal CLK.

Figure 5:
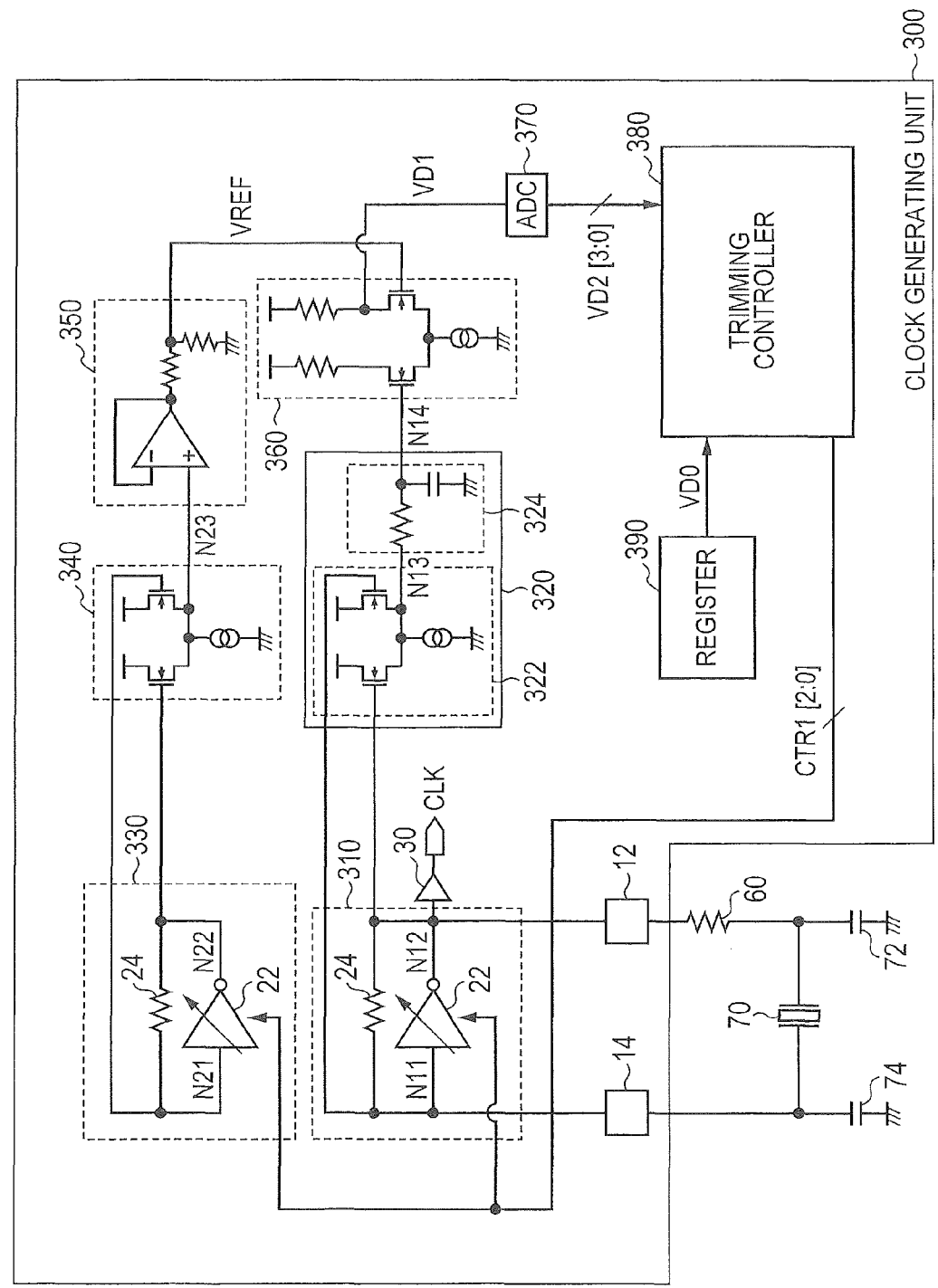
FIG. 5 is a diagram depicting a clock generating unit included in the chip of the receiver depicted in FIG. 4.

FIG. 5 depicts the clock generating unit 300. The clock generating unit 300 includes an oscillation circuit 310, an amplifier 30, an effective value measuring circuit 320, a first replica circuit 330, a second replica circuit 340, a level shift circuit 350, a comparison circuit 360, an A/D converter 370, a trimming controller 380, and a register 390.

The oscillation circuit 310, which is the same as the oscillation circuit 20 in the semiconductor device 1 in FIG. 1, drives the crystal oscillator 70, thereby producing an oscillation signal (a voltage N12 at the output terminal of the inverting amplifier 22), and outputs the oscillation signal to the amplifier 30 and a signal combining circuit 322. The oscillation circuit 310 and the crystal oscillator 70 are coupled in the same way as in the semiconductor device 1.

The inverting amplifier 22 is an inverting amplifier whose gain is variable and its gain is controlled by a control signal CTR1 from the trimming controller 380.

Figure 6:
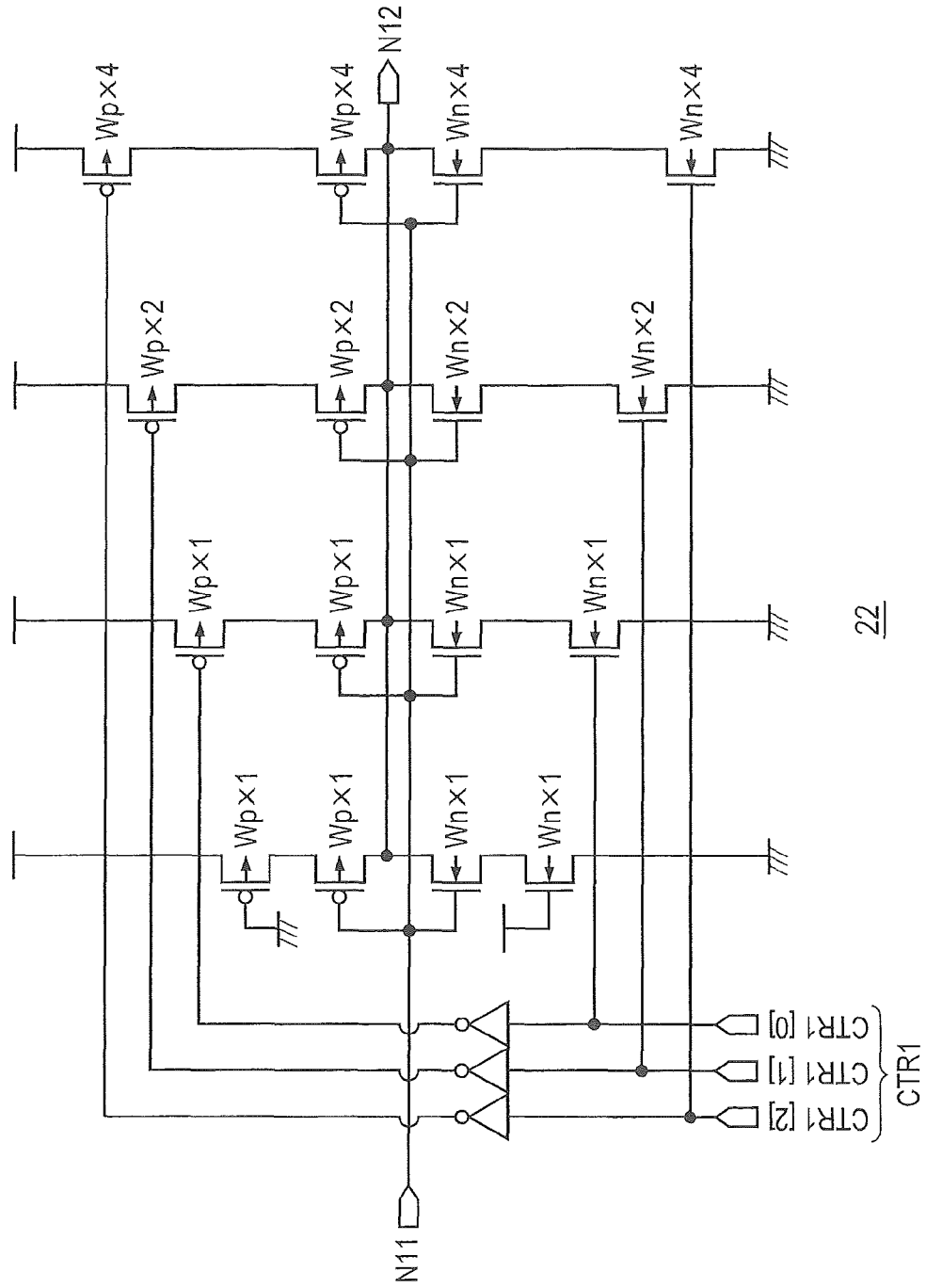
FIG. 6 depicts a configuration example of an inverting amplifier that is included, respectively, in an oscillation circuit and in a first replica circuit of the clock generating unit depicted in FIG. 5.

FIG. 6 depicts a configuration example of the inverting amplifier 22. The inverting amplifier 22 which is depicted in FIG. 6 is controlled by a 3-bit control signal CTR1 (CTR1 [0], CTR1 [1], CTR1 [2]) so that its gain will be any one of eight gain values multiplied by a factor of 1 through 8.

As depicted in FIG. 6, switches, each of which is configured with a transistor, are coupled between power supply and GND nodes of the inverting amplifier 22. These switches are controlled by a control signal CTR1 [with bits 2 thru 0] and roughly divided into four groups. The control signal CTR1 makes switching among the gain values in terms of W size ratios that are given by the transistors which are component elements of the inverting amplifier.

CTR1 [0] selects a group of inverting amplifier elements having a W size ratio of "×1" (in a second column from left in FIG. 6). CTR1 [1] selects a group of inverting amplifier elements having a W size ratio of "×2" (in a third column from left in FIG. 6). CTR1 [2] selects a group of inverting amplifier elements having a W size ratio of "×4" (in a fourth column from left in FIG. 6).

A group in a first column from left is a group of inverting amplifier elements having a W size ratio of "×1" and these elements operate at all times.

Correlations between the combinations of bit values of the control signal CTR1 and the gain values (W size ratios) of the inverting amplifier 22 are presented in FIG. 7.

Although the control signal CTR1 is a 3-bit signal, herein, by way of example, the number of bits of the control signal CTR1 is not limited to 3 and may increase or decrease according to situations in terms of the circuit configuration.

A Return is made to FIG. 5. The effective value measuring circuit 320 includes a signal combining circuit 322 and a low-pass filter 324.

The signal combining circuit 322 includes a differential pair comprised of two transistors (N-type transistors by way of example) and a constant current source to supply operating current to the differential pair. A voltage N11 at the input terminal of the inverting amplifier 22 and a voltage (oscillation signal N12) at the output terminal thereof are input to the gates of the two transistors, respectively. The sources of the two transistors are coupled to each other.

That is, an output N13 of the signal combining circuit 322 (namely, an output of the differential pair) is a voltage N13 resulting from combining the waveforms of the voltage N11 and the oscillation signal N12.

The low-pass filter 324 produces a voltage N14 by smoothing the voltage N13 to an effective level and outputs the voltage N14 to the comparison circuit 360. This voltage N14 is a DC voltage that reflects an effective value of the oscillation signal N12.

That is, in the present embodiment, the effective value measuring circuit 320 produces the voltage N13 having a level reflecting the amplitude of an effective value VE, not the effective value itself of an oscillation signal N12.

If the gain of the inverting amplifier 22 in the oscillation circuit 310 is set to be optimal, the voltage N11 and the oscillation signal N12 are substantially sine waves. Consequently, when these voltage N11 and oscillation signal N12 are input to the signal combining circuit 322, their waveforms are combined by the two transistors in the signal combining circuit 322 and the output (voltage N13) of the signal combining circuit 322 will be a pulsating wave with an arc wave in the upper half plane. Its peak value is about "VCC−Vtn". The voltage N14 which is output by the low-pass filter 324 will be (VCC−Vtn)×(1/√2). Vtn is a threshold value of the transistors in the signal combining circuit 322.

On the other hand, if the gain of the inverting amplifier 22 in the oscillation circuit 310 is too large, the voltage N11 and the oscillation signal N12 become square or rectangular waves. When these waveforms are input to the signal combining circuit 322, at least one of the two transistors in the signal combining circuit 322 comes to be substantially full ON. Consequently, the output (voltage N13) of the signal combining circuit 322 will be a DC level of about "VCC−Vtn". Hence, the voltage V14 which is output by the low-pass filter 324 is "VCC−Vtn", the same as the voltage N13.

The comparison circuit 360, A/D converter 370, trimming controller 380, and register 390 make up the control unit which is the same as the control unit 200 depicted in FIG. 3. The A/D converter 370, trimming controller 380, and register 390 correspond to those of the control execution unit 220 in the control unit 200.

The comparison circuit 360 compares the voltage N14 from the low-pass filter 324 and the reference voltage VREF, obtains a difference VD1 between them, and outputs it to the A/D converter 370.

The A/D converter 370 converts the difference VD1 to a difference VD2 which is a digital value and outputs the difference VD2 to the trimming controller 380.

Figure 8:
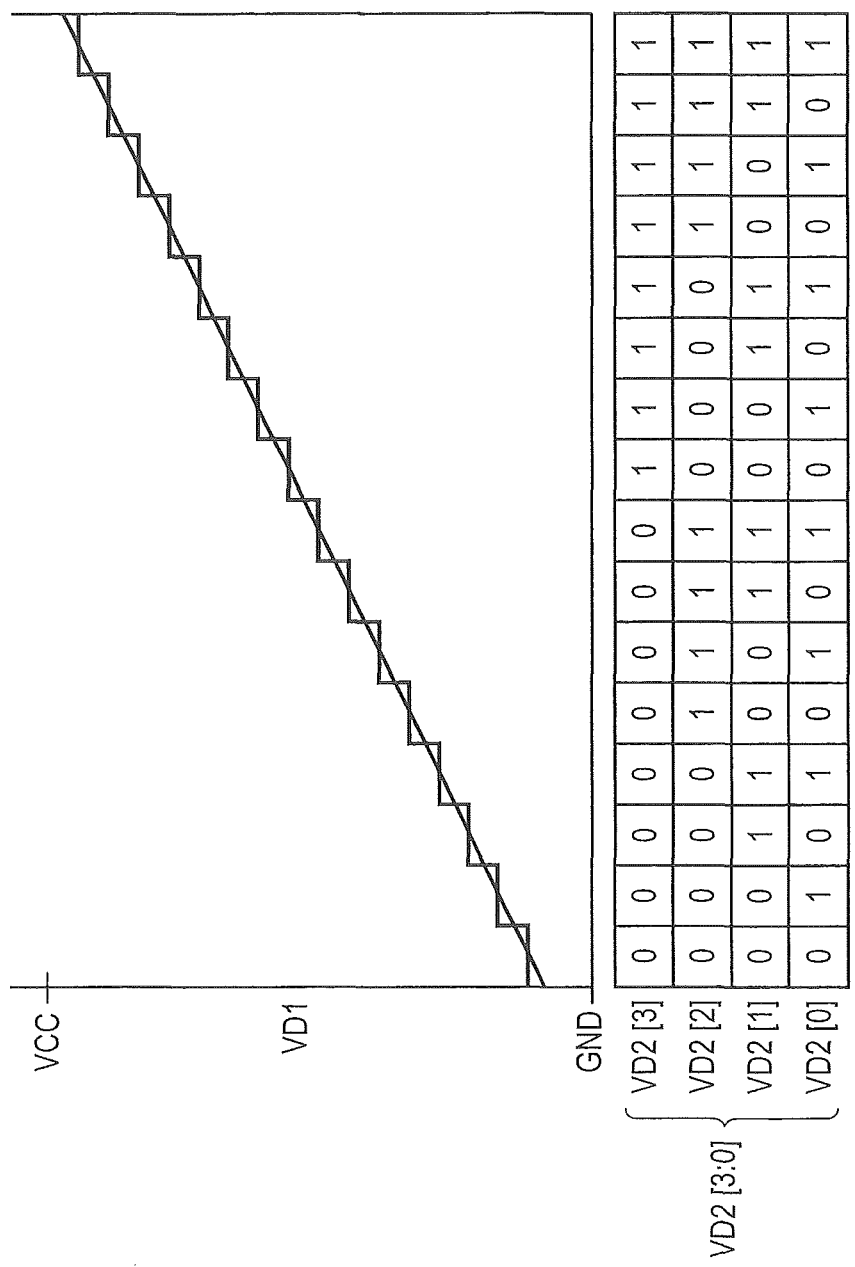
FIG. 8 is a diagram for explaining an A/D converter in the clock generating unit depicted in FIG. 5.

FIG. 8 presents a correlation between the difference VD1 which is output by the comparison circuit 360 and the difference VD2 which is output by the A/D converter 370. In the present embodiment, the A/D converter 370 converts the difference VD1 to a 4-bit digital signal, by way of example. The bits of the digital signal (difference VD2) are VD2 [0] through VD2 [3].

The trimming controller 380 compares the difference VD2 from the A/D converter 370 to a target difference value VD0 which has been set in the register 390 beforehand. According to a result of the comparison, the trimming controller 380 adjusts the gain of the inverting amplifier 22 in the oscillation circuit 310 as well as the gain of the inverting amplifier 22 in the first replica circuit 330 which will be described later in the same manner.

As described previously, in the present embodiment, the trimming controller 380 controls the gain of the inverting amplifier 22, respectively, in the oscillation circuit 310 and in the first replica circuit 330, by way of example, using the 3-bit control signal CTR1. The bits of the control signal CTR1 are CTR1 [0] through CTR1 [2].

A return is made to FIG. 5. In the present embodiment, the reference voltage VREF that is input to the comparison circuit 360 is not a fixed value and it is generated by a reference voltage generating circuit.

The reference voltage generating circuit is comprised of a first replica circuit 330, a second replica circuit 340, and a level shift circuit 350.

The first replica circuit 330 has the same configuration as the oscillation circuit 310 except that it is not coupled to the crystal oscillator 70. To emphasize this respect, the elements in the first replica circuit 330 are assigned the same reference numerals as assigned to the corresponding elements in the oscillation circuit 310.

The inverting amplifier 22 included in the first replica circuit 330 also has the same configuration as the configuration example depicted in FIG. 6 except that a voltage at its input terminal is N21 and a voltage at its output terminal is N22.

The second replica circuit 340 has the same configuration as the signal combining circuit 322 except that the inputs to it are the voltages (N21, N22) at the input and output terminals of the inverting amplifier 22 included in the first replica circuit 330. Hence, a voltage N23 that is output by the second replica circuit 340 will be a stable DC voltage that is nearly one half of the power supply voltage VCC.

The voltage N23 that is output by the second replica circuit 340 is input to the level shift circuit 350. The level shift circuit 350 shifts the voltage V23 and outputs the shifted voltage as the reference voltage VREF to the comparison circuit 360.

The purpose of the level shift circuit 350 is to avoid a decrease in the sensitivity of the comparison circuit 360 due to a too large gap between the levels of reference voltage VREF and voltage N14. The level shift circuit 350 produces the reference voltage VREF, for example, by adding a shift amount of about "((√2−½)×VCC" to the voltage N23.

The target difference value VD0 stored in the register 390 is set beforehand so that an effective value of the oscillation signal N12 will be equal to the target voltage VT when a match has occurred between the difference VD2 output by the A/D converter 370 and the target difference value VD0

The trimming controller 380 compares the target difference value VD0 and the reference voltage VREF from the level shift circuit 350. If a match occurs between them, the trimming controller 380 regards the diving power of the oscillation circuit 310 as optimal and does not adjust the gain of the inverting amplifier 22 in the oscillation circuit 310. Otherwise, if a mismatch occurs between the target difference value VD0 and the reference voltage VREF, the trimming controller 380 adjusts the gain of the inverting amplifier 22 in the oscillation circuit 310 so that the voltage V14 will be equal to the reference voltage VREF.

Figure 9:
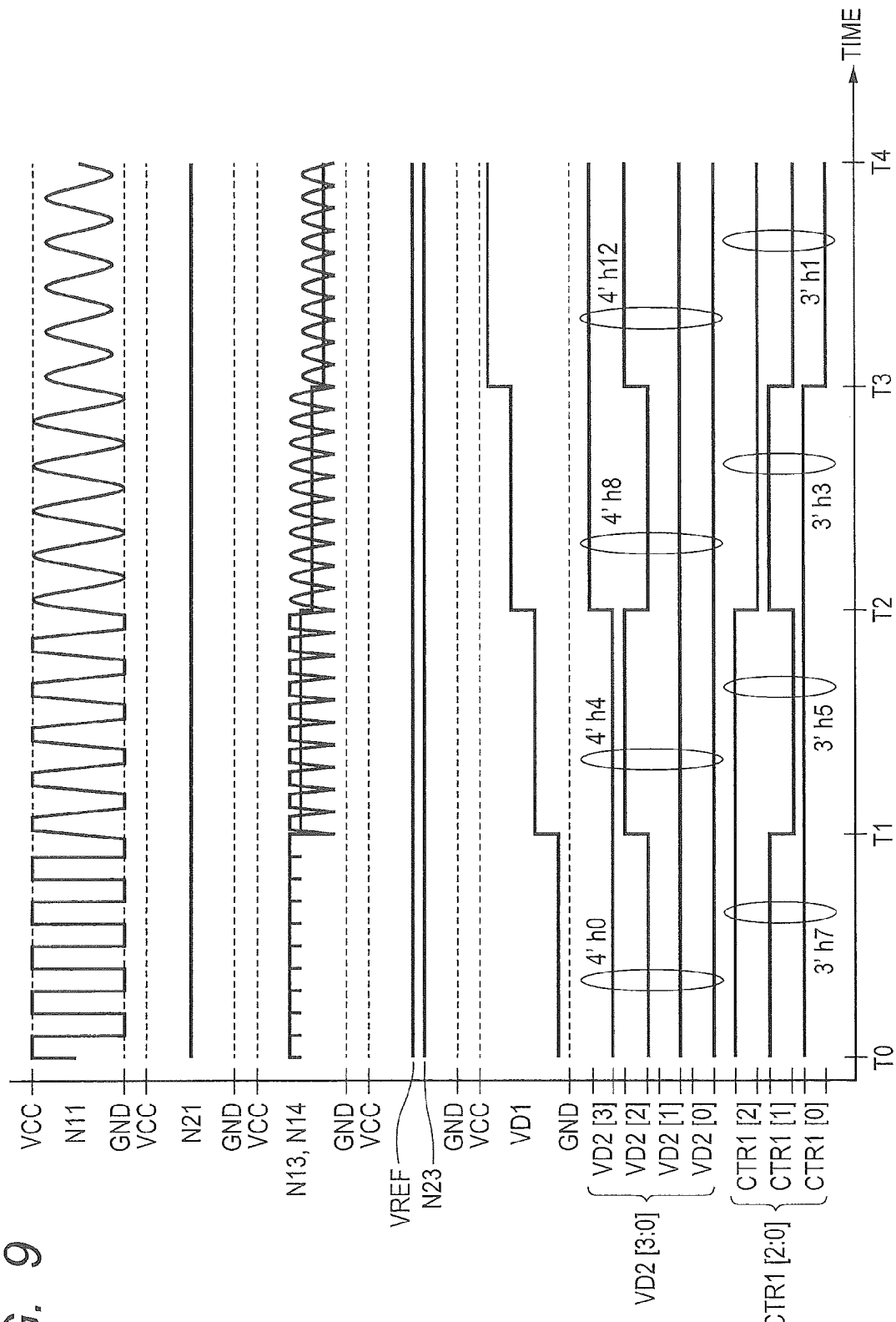
FIG. 9 is a diagram for explaining how the respective signals in the clock generating unit depicted in FIG. 5 undergo transition.

Referring to FIG. 9, a description is provided for how the respective signals within the clock generating unit 300 undergo transition depending on the gain of the inverting amplifier 22 in the oscillation circuit 310 and in the first replica circuit 330. In FIG. 9, in a waveform representation for "N13, N14", a straight line denotes the voltage N14 produced by smoothing the voltage N13 to an effective level by the low-pass filter 324.

<Period from T0 to T1>

This period is a period after power-on and before an adjustment is made of the inverting amplifier 22.

In the present embodiment, by way of example, it is assumed that, immediately after power-on, the control signal CTR1 [bits 2 thru 0] is 3'h7 and the gain of the inverting amplifier 22 is set maximal (at a value multiplied by a factor of 8).

This is for the purpose that oscillation takes place reliably and makes logic circuits operate positively after power-on and before an adjustment is made of the inverting amplifier 22, though there is a possibility that the oscillation signal N12 becomes saturated.

During this period, the oscillation waveform is a square or rectangular wave, as presented for N11 in FIG. 9. The output N14 of the effective value measuring circuit 320 is at the highest voltage level and higher than the reference voltage VREF. Thus, the output (VD1) of the comparison circuit 360 becomes lowest and the difference VD2 [bits 3 thru 0] obtained by the A/D converter 370 becomes 4'h0.

<Period from T1 to T2>

This period is a period after the control signal [bits 2 thru 0] has been decremented to 3'h5.

The gain (W size ratio) of the inverting amplifier 22 included in the oscillation circuit 310 and in the first replica circuit 330 reduces to a value multiplied by a factor of 6 and the oscillation waveform of N11 becomes a trapezoidal wave. N14 comes to a voltage somewhat lower than the voltage for the period from T0 to T1. Accordingly, the output of the comparison circuit 360 becomes somewhat higher and the difference VD2 [bits 3 thru 0] obtained by the A/D converter 370 becomes 4'h4.

<Period from T2 to T3>

This period is a period after the control signal [bits 2 thru 0] has been decremented to 3'h3. Here, the difference between the voltage N14 output from the effective value measuring circuit 320 and the reference voltage VREF output by the level shift circuit 350 is assumed to be smallest.

At this time, the gain of the inverting amplifier 22 included in the oscillation circuit 310 and in the first replica circuit 330 is a value multiplied by a factor of 4, the oscillation waveform of N11 becomes substantially a sine wave, and its amplitude level $V_{p\text{-}p}$ becomes substantially equal to the power supply voltage VCC. N14 comes to a voltage further lower than the voltage during the previous period, the output VD1 of the comparison circuit 360 becomes higher, and the difference VD2 obtained by the A/D converter 370 is 4'h8.

Once this state has been reached, the trimming controller 380 regards the driving power of the oscillation circuit 310 as optimal and does not make a further adjustment. However, because FIG. 9 represents the transitions of the signals, it also represents the signal transitions for a period from T3 to T4 which is a period after the control signal CTR1 [bits 2 thru 0] has been decremented to 3'h1 further from this state.

<Period from T3 to T4>

During this period, the gain of the inverting amplifier 22 included in the oscillation circuit 310 and in the first replica circuit 330 is a value multiplied by a factor of 2. The oscillation waveform of N11 is substantially a sine wave, but its amplitude level $V_{p\text{-}p}$ becomes smaller than the power supply voltage VCC. The output N14 of the effective value measuring circuit 320 comes to a voltage further lower than the voltage during the previous period, the output of the comparison circuit becomes higher, and the difference VD2 [bits 3 thru 0] obtained by the A/D converter 370 is 4'h12.

In this condition, the gain of the inverting amplifier 22 in the oscillation circuit 310 is too small.

Figure 10:
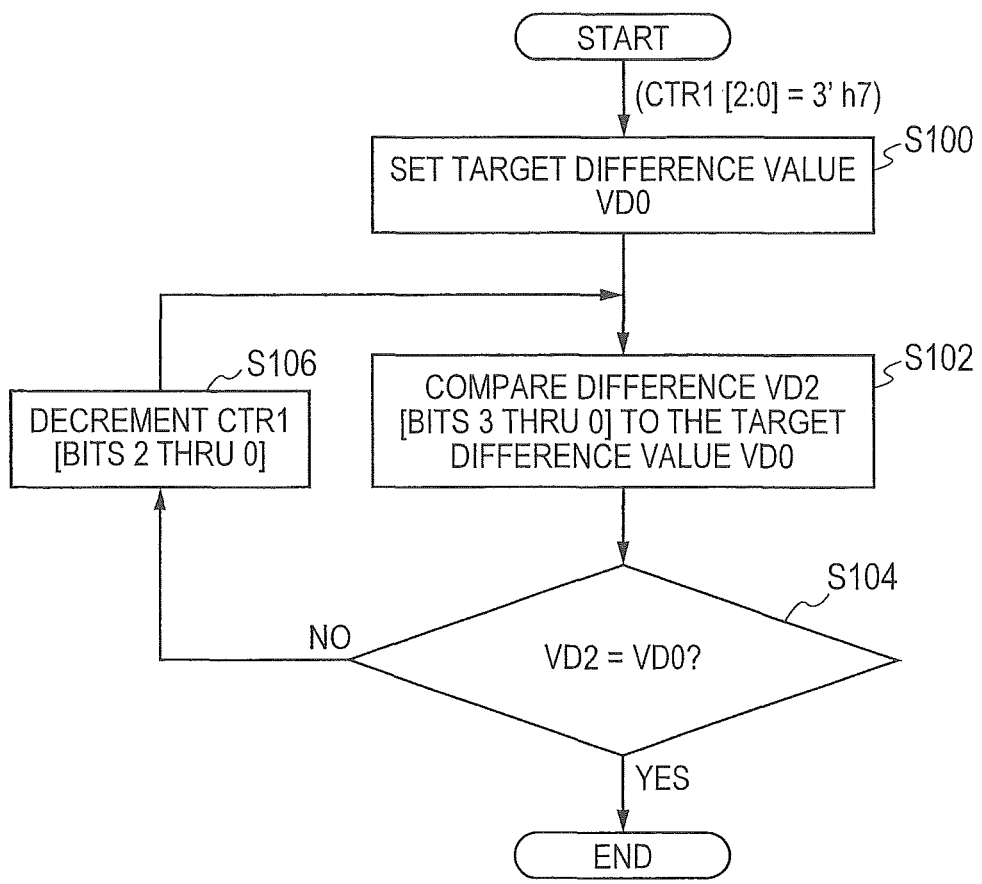
FIG. 10 is a flowchart illustrating operation of the trimming controller in the clock generating unit depicted in FIG. 5.

FIG. 10 is a flowchart illustrating operation of the trimming controller 380 in the clock generating unit 300.

As illustrated in FIG. 10, before an adjustment is made by the trimming controller 380, first, a target difference value VD0 is set into the register 390 beforehand (S100). Note that an initial value of the control signal CTR1 is assumed to be 3'h7 to multiply the gain of the inverting amplifier 22 by a factor of 8 that is maximal.

The voltage N14 output from the effective value measuring circuit 320 and the reference voltage VREF output by the level shift circuit 350 are output to the comparison circuit 360. A difference VD1 obtained by the comparison circuit 360 is converted to a difference VD2 that is then input to the trimming controller 380.

The trimming controller 380 compares the difference VD2 from the A/D converter 370 to the target difference value VD0 set in the register 390 (S102).

If a mismatch occurs between the difference VD2 and the target difference value VD0 (No as determined at S104), the trimming controller 380 determines that the driving power of the oscillation circuit 310 is not optimal and decrements the control signal CTR1 [bits 2 thru 0] to adjust the gain of the inverting amplifier 22 (S106). Then, the process returns to the step S102 of comparing the difference VD2 obtained again after the adjustment to the target difference value VD0.

The trimming controller 380 repeats the process from the step S102 until a match occurs between the difference VD2 and the target difference value VD0. If the match has occurred (Yes as determined at S104), the trimming controller 380 determines that the driving power of the oscillation circuit 310 is optimal, maintains the control signal CTR1 [bits 2 thru 0] at its setting when the match has occurred, and terminates the adjustment.

In the clock generating unit 300 in the receiver 250 of the present embodiment, the effective value measuring circuit 320 generates the voltage N14 that reflects an effective value VE, not the effective value itself of an oscillation signal N12. By supplying the voltage N14 to the comparison circuit for comparison to the reference voltage VREF, it is possible to produce the same advantageous effect as can be produced by the foregoing embodiments.

In the present embodiment, the reference voltage VREF is based on the voltage N23. The voltage N23 is generated by the first replica circuit 330 having the same configuration as the oscillation circuit 310 and the second replica circuit 340 having the same configuration as the signal combining circuit 322. Hence, it is possible to absorb an operating point variation attributed to an variation in the component elements of the oscillation circuit 310 and the effective value measuring circuit 320 and in the layouts of these component elements. Using the reference voltage VREF generated from the voltage N23, the voltage N14 output from the effective value measuring circuit 320 can be compared to that reference voltage VREF and a match/mismatch between these voltages can be determined with a high degree of accuracy. Thus, the gain of the inverting amplifier 22 can be adjusted with a high degree of accuracy as well.

The voltage N23 generated by the first replica circuit 330 and the second replica circuit 340 is not directly input to the comparison circuit 360 as the reference voltage VREF. The voltage N23 after being shifted by the level shift circuit 350 so that the comparison circuit 360 can easily make a comparison is output as the reference voltage VREF to the comparison circuit 360. Thus, the detection accuracy of the comparison circuit 360 can be enhanced.

In order to absorb a variation in manufacturing processes, a low-pass filter having the same configuration as the low-pass filter 324 may be provided between the second replica circuit 340 and the level shift circuit 350.

Because the voltage N21 is a DC signal, the second replica circuit 340 may be removed from the clock generating unit 300. However, if the second replica circuit 340 is removed, while there would be an advantage that the chip size and cost can be reduced, the circuits for generating the voltage N13 (the oscillation circuit 310 and the effective value measuring circuit 320) and the circuit for generating the voltage N23 (only the first replica circuit 330 in this case) would differ in configuration. Hence, only when a variation in the characteristics of the circuits, which can be estimated from the amount of a variation in manufacturing processes depending on process technology, is acceptable, it is preferable to adopt a configuration in which the second replica circuit 340 is removed.

Moreover, of course, the level shift circuit 350 may be removed and the voltage N23 (if the second replica circuit 340 is present) or the voltage N21 (if the second replica circuit 340 is absent) may be directly input to the comparison circuit 360 as the reference voltage VREF.

Fifth Embodiment

Figure 11:
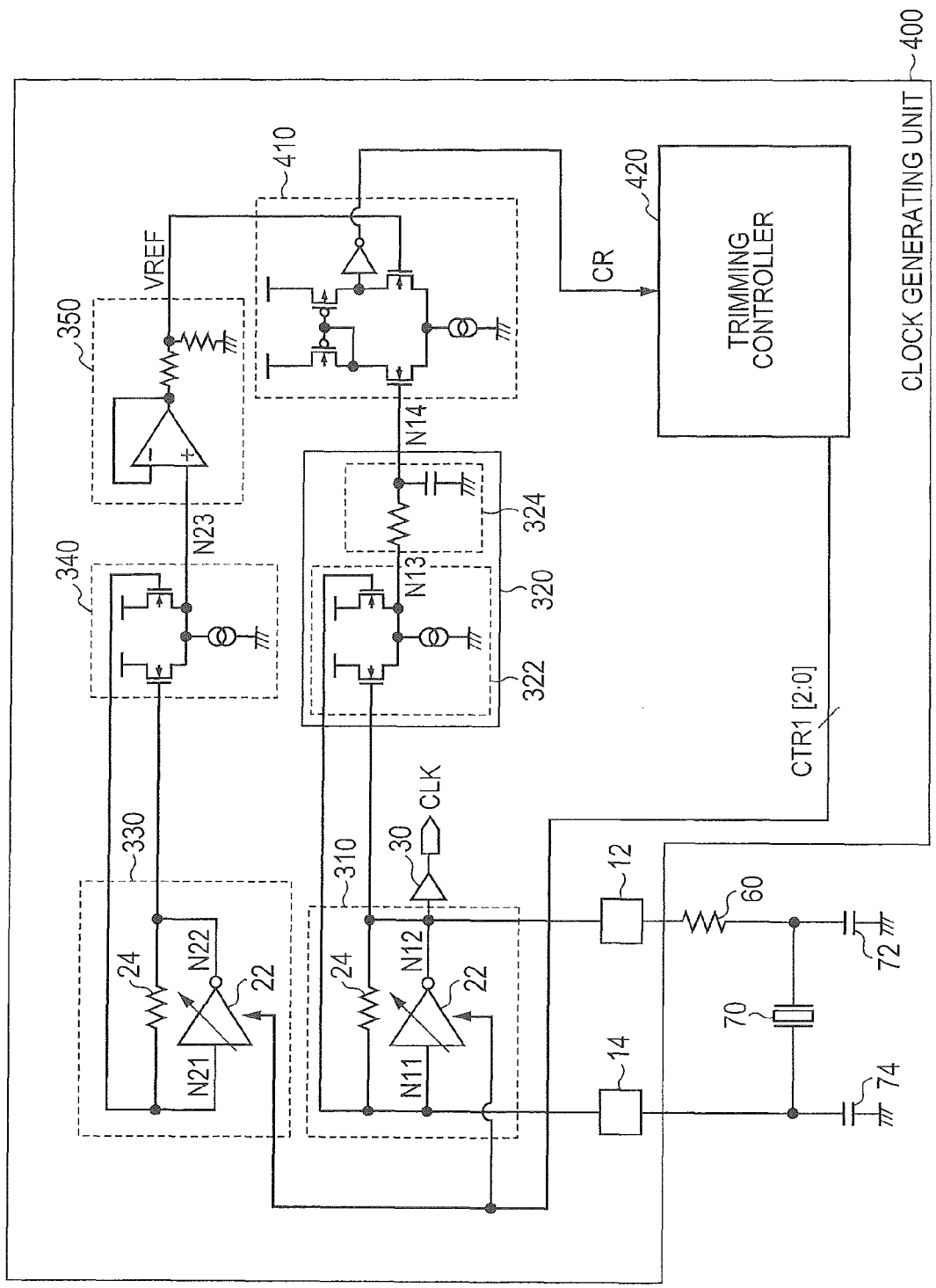
FIG. 11 is a diagram depicting a clock generating unit pertaining to a fifth embodiment.

FIG. 11 depicts a clock generating circuit 400 pertaining to a fifth embodiment. The clock generating circuit 400 can be applied in the receiver 250 in place of the clock generating unit 300.

The control unit in the clock generating unit 300 is comprised of the comparison circuit 360, the A/D converter 370, the trimming controller 380, and the register 390. On the other hand, the control unit in the clock generating circuit 400 is comprised of a comparison circuit 410 and a trimming controller 420, dispensing with the A/D converter 370 and the register 390. A result of comparison made by the comparison circuit 360 in the clock generating unit 300 is a difference VD1 between the voltage N14 and the reference voltage VREF, whereas the comparison circuit 410 in the clock generating circuit 400 obtains a result of comparison CR indicating whether the voltage N14 is larger or smaller than the reference voltage VREF. Except for these respects, the clock generating unit 400 is the same as the clock generating unit 300.

Specifically, the comparison circuit 410 outputs a high level, if the voltage N14 is larger than the reference voltage VREF, and outputs a low level, if the voltage N14 is smaller than the reference voltage VREF.

The trimming controller 420 performs an arithmetic operation according to the result of comparison CR made by the comparison circuit 410, generates a control signal CTR1 to control the gain of the inverting amplifier 22, and outputs it to the inverting amplifier 22.

Figure 12:
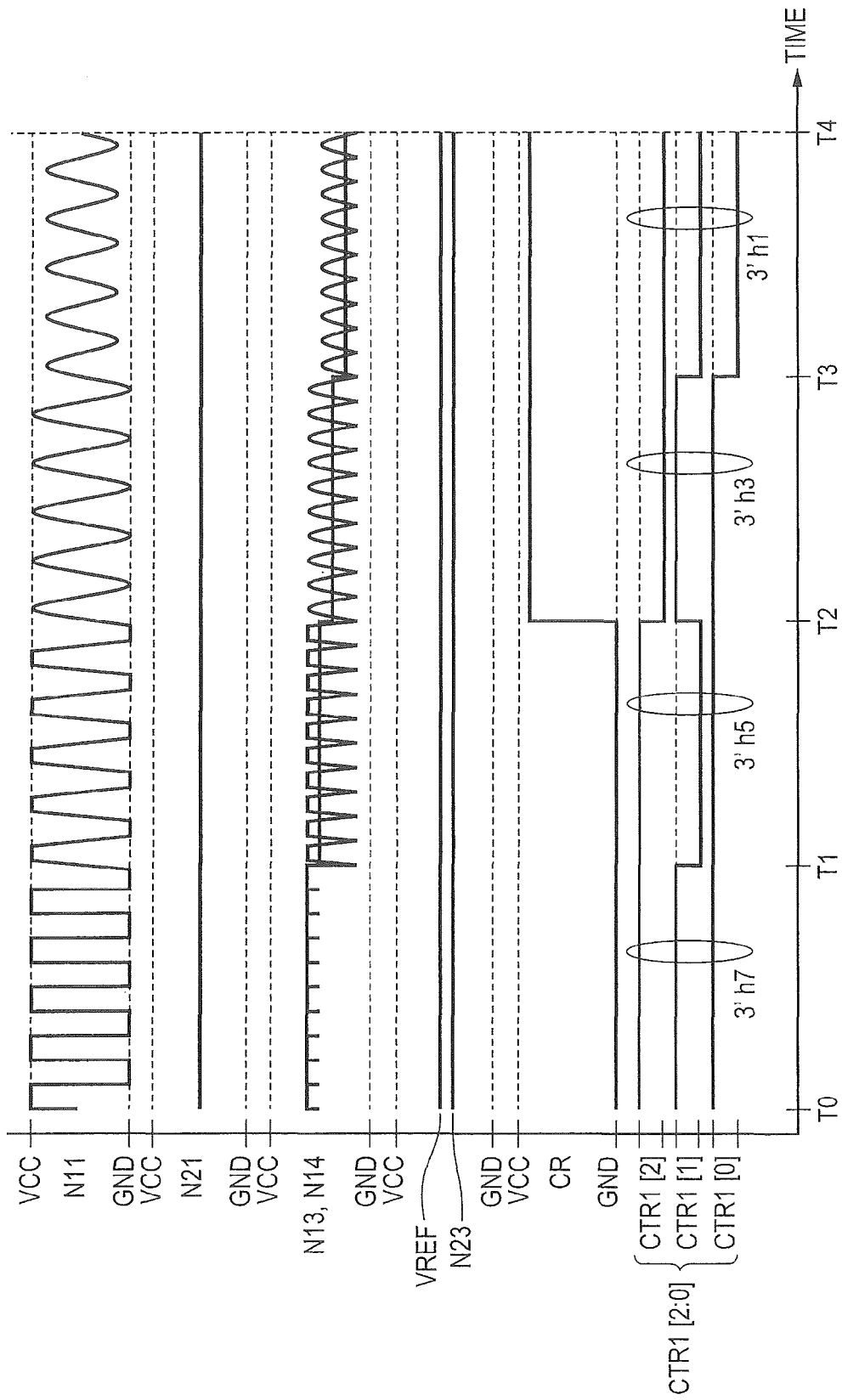
FIG. 12 is a diagram for explaining how the respective signals in the clock generating unit depicted in FIG. 11 undergo transition.

Referring to FIG. 12, a description is provided for how the respective signals within the clock generating unit 400 undergo transition. Similarly as in FIG. 9, in FIG. 12, in a waveform representation for "N13, N14", a straight line denotes the voltage N14 produced by smoothing the voltage N13 to an effective level by the low-pass filter 324.

<Period from T0 to T1>

This period is a period after power-on and before an adjustment is made of the inverting amplifier 22.

Also in the present embodiment, immediately after power-on, the control signal CTR1 [bits 2 thru 0] is 3'h7 and the gain of the inverting amplifier 22 is set maximal (at a value multiplied by a factor of 8).

During this period, the oscillation waveform is a square or rectangular wave, as presented for N11 in FIG. 12. The output N14 of the effective value measuring circuit 320 is at the highest voltage level and higher than the reference voltage VREF. Thus, a result of comparison CR output by the comparison circuit 410 is low (0).

<Period from T1 to T2>

This period is a period after the control signal [bits 2 thru 0] has been decremented to 3'h5. The gain of the inverting amplifier 22 included in the oscillation circuit 310 and in the first replica circuit 330 reduces to a value multiplied by a factor of 6 and the oscillation waveform of N11 becomes a trapezoidal wave. N14 comes to a voltage somewhat lower than the voltage for the period from T0 to T1, but is higher than the reference voltage VREF. Thus, the result of comparison CR output by the comparison circuit 410 is still low (0).

<Period from T2 to T3>

This period is a period after the control signal [bits 2 thru 0] has been decremented to 3'h3. Here, it is assumed that the voltage N14 output from the effective value measuring circuit 320 and the reference voltage VREF output by the level shift circuit 350 are at nearly the same level, but the voltage N14 is slightly lower.

At this time, the gain of the inverting amplifier 22 included in the oscillation circuit 310 and in the first replica circuit 330 is a value multiplied by a factor of 4, the oscillation waveform of N11 becomes substantially a sine wave, and its amplitude level $V_{p\text{-}p}$ becomes substantially equal to the power supply voltage VCC. N14 comes to a voltage further lower than the voltage during the previous period and becomes lower than the reference voltage VREF. Thus, the result of comparison CR output by the comparison circuit 410 changes to a high level (1).

Once this state has been reached, the trimming controller 420 regards the driving power of the oscillation circuit 310 as optimal and does not make a further adjustment. However, because FIG. 12 represents the transitions of the signals, it also represents the signal transitions for a period from T3 to T4 which is a period after the control signal [bits 2 thru 0] has been decremented to 3'h1 further from this state.

<Period from T3 to T4>

During this period, the gain of the inverting amplifier 22 included in the oscillation circuit 310 and in the first replica circuit 330 is a value multiplied by a factor of 2. The oscillation waveform of N11 is substantially a sine wave, but its amplitude level $V_{p\text{-}p}$ becomes smaller than the power supply voltage VCC. The output N14 of the effective value measuring circuit 320 comes to a voltage further lower than the voltage during the previous period and the result of comparison CR output by the comparison circuit 410 is still high.

In this condition, the gain of the inverting amplifier 22 in the oscillation circuit 310 is too small.

Figure 13:
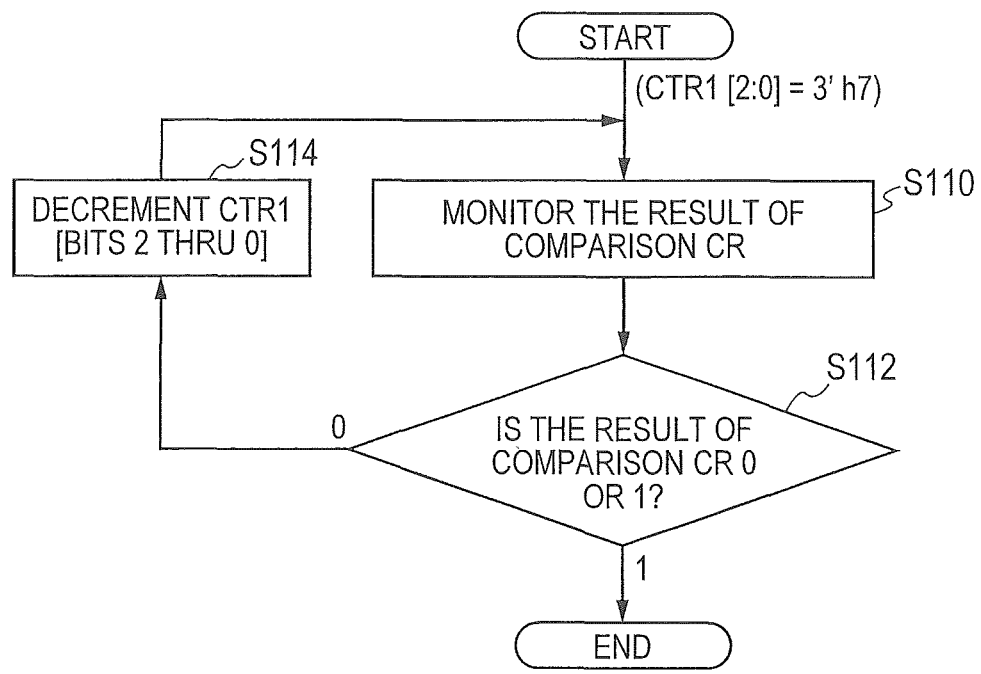
FIG. 13 is a flowchart illustrating operation of the trimming controller in the clock generating unit depicted in FIG. 11.

FIG. 13 is a flowchart illustrating operation of the trimming controller 420 in the clock generating unit 400.

As illustrated in FIG. 13, an initial value of the control signal CT1 that is output by the trimming controller 420 is 3'h7 to multiply the gain of the inverting amplifier 22 by a factor of 8 that is maximal.

The trimming controller 420 monitors the result of comparison output by the comparison circuit 410 (S110) and decrements the control signal CTR (S114, when CR is 0, as determined at S112, and S110 and subsequent steps are repeated) until the result of comparison becomes high (1) (when CR is 1, as determined at S112).

If the result of comparison CR has become high (when CR is 1, as determined at S112), the trimming controller 420 determines that the driving power of the oscillation circuit 310 is optimal, maintains the control signal CTRL [bits 2 thru 0] at its setting when CR has become high, and terminates the adjustment.

According to the clock generating circuit 400 pertaining to the present embodiment, it is possible to produce the same advantageous effect as can be produced by the foregoing embodiments. Besides, because the comparison circuit 410 outputs the result of comparison CR that is a binary digital signal, there is no need for providing an A/D converter that makes an A/D conversion of the result of comparison made by the comparison circuit 410 and a register that stores a target difference value VD0. Hence, the circuit size can be reduced.

Alternative Embodiment

In respect to the clock generating unit 300 depicted in FIG. 5 or the clock generating circuit 400 depicted in FIG. 11, the resistance values of two resistors included in the level shift circuit 350 may be made variable. Adjusting the resistance values of the two resistors may be performed by, for example, the trimming controller 380 or the trimming controller 420.

By doing so, the reference voltage VREF can also be adjusted and, thus, a match/mismatch determination can be made with a higher degree of accuracy and more flexibly.

While the invention made by the present inventors has been described specifically based on its embodiments hereinbefore, it will be obvious that the present invention is not limited to the already described embodiments and various modifications may be made therein without departing from the scope of the invention.

What is claimed is:

1. A semiconductor device comprising:
an oscillation circuit including an inverting amplifier whose input terminal and output terminal are coupled, respectively, to an output side and an input side of a crystal oscillator, and produces a voltage at the output terminal as an oscillation signal;
an effective value measuring circuit measuring an effective value of the oscillation signal; and
a control unit adjusting gain of the inverting amplifier so that the effective value measured by the effective value measuring circuit will be equal to a target voltage,
wherein the control unit determines a difference between the effective value and a reference voltage, generates a digital difference value based on the difference, and controls the inverting amplifier based on a comparison of the digital difference value to a target digital difference value.

2. A semiconductor device comprising:
an oscillation circuit including an inverting amplifier whose input terminal and output terminal are coupled, respectively, to an output side and an input side of a crystal oscillator, and produces a voltage at the output terminal as an oscillation signal;
an effective value measuring circuit measuring an effective value of the oscillation signal;
a damping resistor that is coupled between the output terminal of the inverting amplifier and the input side of the crystal oscillator; and
a control unit which controls the effective value measured by the effective value measuring circuit to be equal to a target voltage by at least one of:
adjusting a gain of the inverting amplifier; and
adjusting a resistance value of the damping resistor.

3. The semiconductor device according to claim 1, wherein the control unit comprises:
a comparison circuit comparing the effective value measured by the effective value measuring circuit to reference voltage; and
a control execution unit executing an adjustment so that the effective value of the oscillation signal will be equal to the target voltage, based on a result of comparison made by the comparison circuit.

4. The semiconductor device according to claim 3, further comprising a reference voltage generating unit that generates the reference voltage,
wherein the reference voltage generating unit comprises a first replica circuit having the same configuration as the oscillation circuit except that it is not coupled to the crystal oscillator and outputs an output voltage of an inverting amplifier included in the first replica circuit as the reference voltage, and
wherein the control unit similarly adjusts gain of the inverting amplifier included in the first replica circuit, when adjusting the gain of the inverting amplifier included in the oscillation circuit.

5. The semiconductor device according to claim 4, wherein the effective value measuring circuit comprises:
a differential pair to which respective voltages at the input terminal and at the output terminal of the inverting amplifier included in the oscillation circuit are input respectively;
a constant current source supplying operating current to the differential pair; and
a low-pass filter coupled to an output node of the differential pair,
wherein an output of the low-pass filter is output to the comparison circuit, and
wherein the comparison circuit compares the output of the low-pass filter to the reference voltage.

6. The semiconductor device according to claim 5, wherein the reference voltage generating unit further comprises a second replica circuit having the same configuration as the effective value measuring circuit except that the respective voltages at the input terminal and the output terminal of the inverting amplifier included in the first replica circuit are input thereto and the low-pass filter is not provided therein, and
wherein the reference voltage generating unit outputs an output voltage of a differential pair included in the second replica circuit as the reference voltage.

7. The semiconductor device according to claim 6, wherein the reference voltage generating unit further comprises a level shift circuit coupled between the second replica circuit and the comparison circuit, and wherein, after the level of an output voltage of the differential pair in the second replica circuit is shifted by the level shift circuit, the reference voltage generating unit outputs the level-shifted output voltage as the reference voltage.

8. The semiconductor device according to claim 7, wherein the control unit is capable of adjusting a shift amount applied by the level shift circuit.

9. The semiconductor device according to claim 1, wherein the input terminal of the inverting amplifier is coupled via a first pad to one end of the crystal oscillator and an output terminal of the inverting amplifier is coupled via a second pad and a damping resistor to the other end of the crystal oscillator.

10. The semiconductor device according to claim 1, wherein a voltage at the output terminal of the inverting amplifier is supplied as a clock signal CLK via an amplifier to a logic circuit.

11. The semiconductor device according to claim 3, wherein the comparison circuit obtains a difference value between the effective value and the reference voltage as a result of the comparison.

12. The semiconductor device according to claim 11, wherein the control execution unit comprises:
an A/D converter which makes an A/D conversion of the difference value from the comparison circuit to generate a digital difference value;
a register in which a target digital difference value is set; and
a trimming controller which compares the digital difference value from the A/D converter and the target digital difference value to generate a control signal, and outputs the control signal to the inverting amplifier.

13. A semiconductor device comprising:
an oscillation circuit including an inverting amplifier whose input terminal and output terminal are coupled, respectively, to an output side and an input side of a crystal oscillator, and produces a voltage at the output terminal as an oscillation signal;
an effective value measuring circuit measuring an effective value of the oscillation signal;
a damping resistor that includes a variable resistance value and is coupled between the output terminal of the inverting amplifier and the input side of the crystal oscillator; and
a control unit adjusting the resistance value of the damping resistor so that the effective value measured by the effective value measuring circuit will be equal to a target voltage.

14. The semiconductor device according to claim 13, wherein the control unit determines a difference between the effective value and a reference voltage, generates a digital difference value based on the difference, and controls the damping resistor based on a comparison of the digital difference value to a target digital difference value.

* * * * *